US011025214B2

(12) United States Patent
Dufrene

(10) Patent No.: US 11,025,214 B2
(45) Date of Patent: Jun. 1, 2021

(54) LOW VOLTAGE CLASS AB OPERATIONAL TRANS-CONDUCTANCE AMPLIFIER

(71) Applicant: Intel Corporation, Santa Clara, CA (US)

(72) Inventor: Krzysztof Dufrene, Plesching (AT)

(73) Assignee: Intel Corporation, Santa Clara, CA (US)

( * ) Notice: Subject to any disclaimer, the term of this patent is extended or adjusted under 35 U.S.C. 154(b) by 15 days.

(21) Appl. No.: 16/259,934

(22) Filed: Jan. 28, 2019

(65) Prior Publication Data

US 2020/0244239 A1 Jul. 30, 2020

(51) Int. Cl.
*H03F 3/45* (2006.01)
*H03F 1/02* (2006.01)

(52) U.S. Cl.
CPC ....... *H03F 3/45273* (2013.01); *H03F 1/0211* (2013.01); *H03F 3/45246* (2013.01)

(58) Field of Classification Search
CPC ..................................................... H03F 3/452
See application file for complete search history.

(56) References Cited

U.S. PATENT DOCUMENTS

| 5,376,899 | A | | 12/1994 | Pass | |
|---|---|---|---|---|---|
| 5,598,129 | A | * | 1/1997 | Chambers | H03F 3/265 330/253 |
| 5,854,573 | A | * | 12/1998 | Chan | H03F 1/086 330/292 |
| 6,166,592 | A | * | 12/2000 | Walden | G06G 7/12 327/103 |
| 6,750,716 | B2 | | 6/2004 | Cusinato et al. | |
| 7,362,173 | B1 | * | 4/2008 | Knausz | H03F 3/4521 330/253 |
| 2004/0135627 | A1 | * | 7/2004 | Yamazato | H03F 3/68 330/85 |
| 2006/0066400 | A1 | | 3/2006 | Kang et al. | |
| 2006/0091955 | A1 | * | 5/2006 | Choi | H03F 3/3022 330/260 |
| 2008/0272844 | A1 | | 11/2008 | Rayanakorn et al. | |
| 2011/0043270 | A1 | * | 2/2011 | Kusuda | G06G 7/186 327/337 |
| 2011/0148893 | A1 | * | 6/2011 | An | G09G 3/3614 345/545 |

(Continued)

OTHER PUBLICATIONS

Peluso, V. et al., "900mV Differential Class AB OTA For Switched Opamp Applications", Electronics Letters, vol. 33, No. 17, Aug. 1997, DOI: 10.1049/el:19970964. pp. 1455-1456.

(Continued)

*Primary Examiner* — Patricia T Nguyen
(74) *Attorney, Agent, or Firm* — Green, Howard & Mughal LLP

(57) ABSTRACT

Described is high-current drive class AB operational trans-conductance amplifier (OTA) output that can operate under low supply voltages (e.g., below 0.9 V) while maintaining desired functionality (e.g., reliable startup behavior, well-defined biasing currents, phase margins for improved stability) over a broad range of process, voltage, and temperature variations. The class AB OTA comprises a pre-amplifier stage, and a differential OTA output stage coupled to the pre-amplifier stage, wherein the differential OTA output stage comprises at least four folded cascode transistors.

20 Claims, 11 Drawing Sheets

(56) References Cited

U.S. PATENT DOCUMENTS

| | | |
|---|---|---|
| 2015/0009017 A1 | 1/2015 | Gay et al. |
| 2015/0072740 A1* | 3/2015 | Gupta ................... H03F 3/191 |
| | | 455/571 |
| 2019/0245524 A1* | 8/2019 | Kim ....................... H03K 3/012 |
| 2020/0035175 A1* | 1/2020 | Choi ................... H03F 3/45744 |

OTHER PUBLICATIONS

International Search Report & Written Opinion dated Jan. 29, 2020 for PCT Patent Application No. PCT/US2019/055062.

* cited by examiner

LOW VOLTAGE CLASS AB OPERATIONAL TRANS-CONDUCTANCE AMPLIFIER

BACKGROUND

Operational trans-conductance amplifier (OTA) receives a differential input voltage and generates an output current. As power supply voltage levels reduce to 0.8V and lower, while threshold voltages of transistors do not scale down, existing OTA architectures suffer various challenges. For example, existing OTA performance (e.g., gain, phase margin, output current drive, etc.) become highly sensitive to process, voltage, and temperature (PVT) variations as power supply levels reach 0.8V and lower. Further, in communication devices, as interferer levels reaching analog baseband increase due to reduced front-end selectivity and carrier aggregation scenarios, existing OTA when operated at lower power supply voltages (e.g., 0.8V) cannot accommodate large signal interferers.

The background description provided herein is for generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
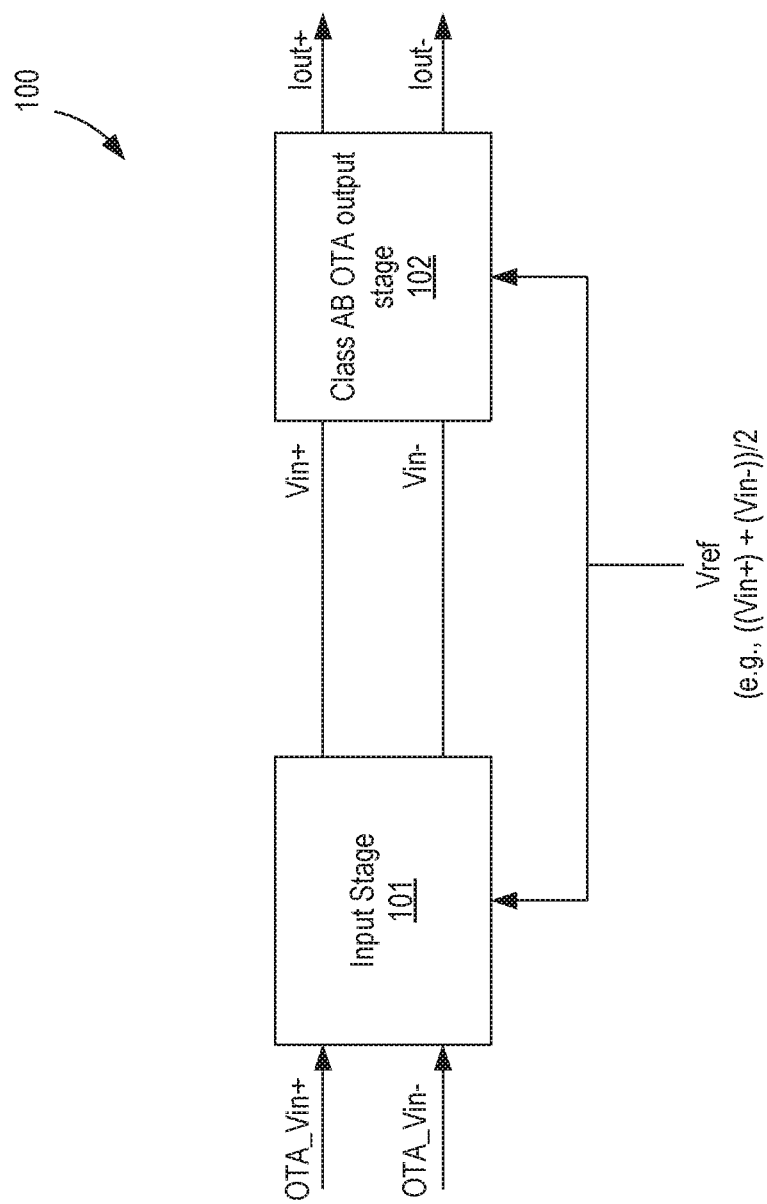
FIG. 1 illustrates a high-level class AB OTA with an input stage and an output stage, in accordance with some embodiments.

Described, is high-current drive class AB operational trans-conductance amplifier (OTA) output stage that in some embodiments can operate under low supply voltages (e.g., below 0.9 V) while maintaining desired functionality (e.g., reliable startup behavior, well-defined biasing currents, phase margins for improved stability) over a broad range of process, voltage, and temperature variations. The class AB OTA of some embodiments comprises a pre-amplifier stage, and a differential OTA output stage coupled to the pre-amplifier stage, wherein the differential OTA output stage comprises at least four folded cascode transistors. The folded cascode transistors provide appropriate biasing current to keep the driving transistors in saturation region even when the power supply voltage is reduced to 0.9V and lower. In some embodiments, a feedforward path is provided inside the OTA output stage by bypassing the input stage or pre-amplifier. In some embodiments, a trans-conductance feed-forward path is provided by injecting current into the drain terminals of the input transistors of the OTA output stage. In some embodiments, a startup circuity is provided to ensure current flow through input transistors. As such, transistors of the OTA output stage are biased and operate as expected upon startup.

There are many technical effects of the various embodiments. For example, the OTA output stage improves robustness across PVT while reducing operating power supply to less than 0.9V. The feedforward path and the trans-conductance feedforward path increases phase margin to improve stability of the OTA output stage. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device.

The term "between" may be employed in the context of the z-axis, x-axis or y-axis of a device. A device that is between two other devices may be directly connected to one or both of those devices, or it may be separated from both of the other two devices by one or more intervening devices.

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1 illustrates a high-level class AB OTA 100 with an input stage and an output stage, in accordance with some embodiments. OTA 100 comprises an input stage 101 and an output stage 102. In some embodiments, input stage 201 comprises a preamplifier that receives differential input voltages OTA_Vin+ and OTA_Vin− and generate amplified differential voltages Vin+ and Vin−. These amplified differential voltages Vin+ and Vin− are received by the OTA output stage that generates a differential current Iout+ and Iout−. In some embodiments, input stage 101 and OTA output stage 102 receive reference voltage Vref (e.g., ((Vin+)+(Vin−))/2) to internally set a well-defined common mode voltage at its output.

In various embodiments, differential OTA output stage 102 comprises at least four folded cascode transistors. In some embodiments, differential OTA output stage 102 comprises first and second transistors to receive the amplified versions of the first and second inputs (e.g., Vin+ and Vin−) at their corresponding gate terminals, respectively, wherein the first and second transistors are coupled to first and second folded cascode transistors, respectively, of the at least four folded cascode transistors, and wherein the first and second folded cascode transistors are of a first conductivity type (e.g., n-type). In some embodiments, differential OTA output stage 102 comprises a first current source coupled in series to the first folded cascode transistor and a first reference supply rail. In some embodiments, differential OTA output stage 102 comprises a second current source coupled in series to the second folded cascode transistor and a second reference supply rail.

In some embodiments, the first and second folded cascode transistors are to receive a first bias. In some embodiments, the at least four folded cascode transistors further comprises third and fourth folded cascode transistors to receive a second bias separate from the first bias. In some embodiments, the third and fourth folded cascode transistors are of a second conductivity type (e.g., p-type). In some embodiments, differential OTA output stage 102 comprises at least four transistors of the first conductivity type, wherein the at least four transistors have gate terminals coupled to a reference. In some embodiments, a first transistor of the at least four transistors is coupled to the first transistor that receives Vin+. In some embodiments, a second transistor of the at least four transistors is coupled to the first folded cascode transistor. In some embodiments, a third transistor of the at least four transistors is coupled to the second transistor that receives the amplified version of the second input. In some embodiments, a fourth transistor of the at least four transistors is coupled to the second folded cascode transistor. In some embodiments, the reference causes the at least four transistors to turn off after a startup duration. In some embodiments, the reference is provided to the at least four transistors at a startup duration. In some embodiments, each of the at least four transistors is smaller (e.g., smaller W/L) than each of the first and second transistors that receive the amplified versions of the first and second inputs, respectively. In some embodiments, the reference is programmable. In some embodiments, a trans-conductance stage is provided which is coupled to pre-amplifier 101. The trans-conductance stage receives the first and second inputs, and provides first and second currents. In some embodiments, the first and second currents from the trans-conductance stage are provided to drain terminals of the first and second transistors that receive the amplified versions of the first and second inputs at their corresponding gate terminals, respectively.

Figure 2:
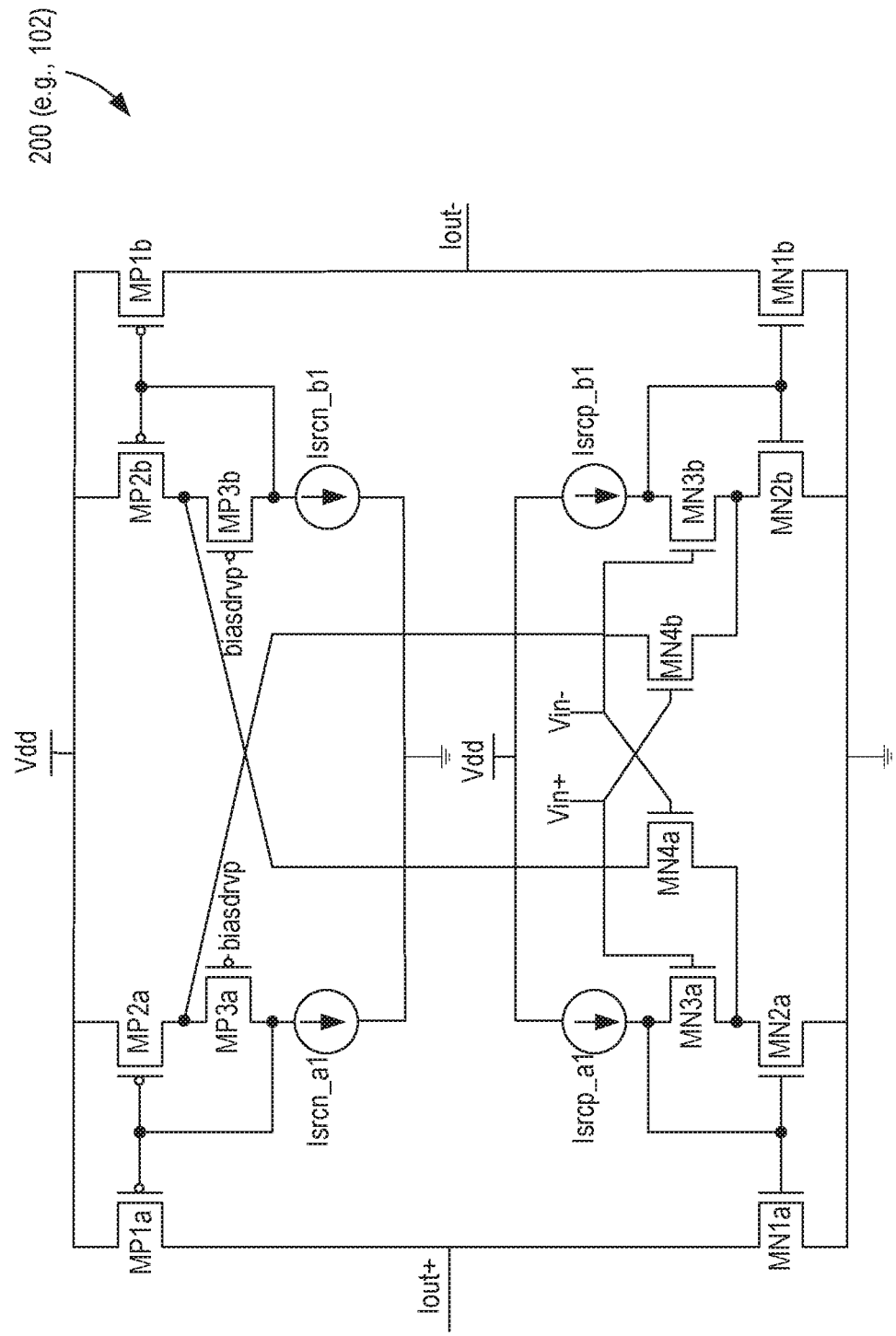
FIG. 2 illustrates a low voltage class AB OTA output stage, in accordance with some embodiments.

FIG. 2 illustrates a low voltage class AB OTA output stage 200, in accordance with some embodiments. In some embodiments, output stage 200 comprises four current mirrors, four current sources Isrcp_a1, Isrcp_b1, Isrcn_a1, and Isrcn_b1, n-type input transistors MN4a and MN4b, input nodes Vin+ and Vin−, and output nodes Iout+ and Iout− coupled together as shown. The four current mirrors include two n-type current mirrors and two p-type current mirrors. The first n-type current mirror comprises n-type transistors MN1a, MN2a, and MN3a coupled to p-type current source Isrcp_a1 and a first reference supply (e.g., ground). The second n-type current mirror comprises n-type transistors MN1b, MN2b, and MN3b coupled to p-type current source Isrcp_b1 and the first reference supply (e.g., ground). The third n-type current mirror comprises p-type transistors MP1a, MP2a, and MP3a coupled to n-type current source Isrcn_a1 and a second reference supply (e.g., power supply Vdd). The fourth n-type current mirror comprises p-type transistors MP1b, MP2b, and MP3b coupled to n-type current source Isrcn_b1 and the second reference supply.

In some embodiments, Vin+ controls the n-type transistor MN3a while Vin− controls the n-type transistor MN3b. In some embodiments, bias signal, biasdrvp, controls or biases the p-type transistors MP3a and MP3b. Here, transistors MN2a and MN3a form a current buffer loop that provides a low impedance point at the source of input transistor MN4a. When a constant gate voltage biases the gate of MN3a, the drain of MN2a is virtually fixed. As such, a voltage applied at the gate of MN4a generates an exponential or quadratic current, depending on the region of operation. In the embodiment of FIG. 2, Vin+ biases transistor. The current buffer loop configuration allows to keep a constant current through transistor MN3a, which behaves as a voltage follower. In this example, the drain of MN2a sees a voltage excursion opposite to the signal applied at the gate of MN4a if a differential input signal is applied. As such, the gate-source voltage of MN4a (e.g., Vgs, MN4a) is now doubled, generating a larger current through MN4a. This configuration uses the current generated by transistor MN4a twice.

For example, first, the current flows through transistor MN2a, and is mirrored to Iout+, and second, the current is also recuperated at the drain of transistor MN4a by another current buffer loop (comprising transistors MP2b and MP3b and mirrored to Iout−. This other current buffer acts as a low voltage current mirror.

The circuit topology of output stage 200 is highly power consumption efficient (e.g., low quiescent current while being able to deliver over a magnitude larger AC current) and highly linear as it uses trans-linear current mirror buffers. The current mirror buffers have very low input impedances resulting in low AC voltage swings. Further, cross-coupling architecture suppresses undesired differential-excitation-to-common-mode response.

Figure 3:
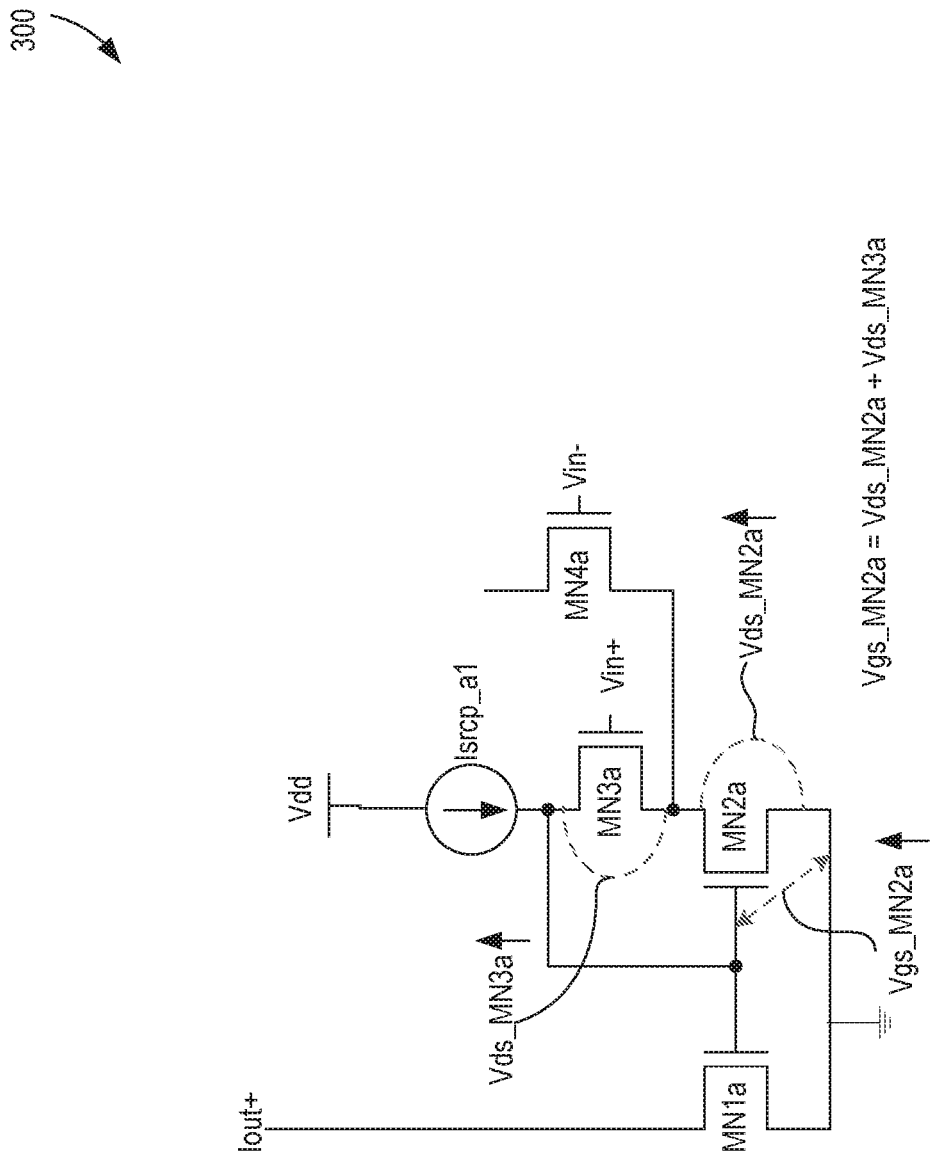
FIG. 3 illustrates a portion of the OTA output stage of FIG. 2.

FIG. 3 illustrates portion 300 of the OTA output stage of FIG. 2. Portion 300 zooms into the lower left current mirror and associated transistors comprises MN1a, MN2a, MN3a, and MN4a. The gate-source voltage of output current mirror devices MN1a and MN2a is equal to the sum of drain-source voltages of diode-side transistor MN2a and driver transistor MN3a (e.g., Vgs_MN2a=Vds_MN2a+Vds_MN3a). The drain-source voltage Vds_MN2a is kept low due to driver devices MN3a and MN4a having gate input common mode voltages fixed at reasonably high levels (e.g., half of supply voltage Vdd). This leaves some headroom for Vds_MN3a. However, in some cases, the headroom may not be sufficient to accommodate variations over process and temperature.

For instance, considering Vdd=1V, nominal threshold voltage of transistors Vth=300 mV, and devices biased slightly above that voltage (class AB mode) e.g., Vgs=325 mV, results in Vds_MN2a=175 mV and Vds_MN3a=325 mV−175 mV=150 mV, keeping MN3a device in saturation. Unfortunately, since Vth varies over process typically +/−50 mV and over temperature about 1 mV/K, expected variation from slow-cold (e.g., −40 deg. C.) to fast-hot (e.g., +100 deg. C.) corners is +−120 mV. This leads to Vgs_MN2a=200 mV at fast-hot corner. This means, at fast-hot corner, it may be a challenge to keep MN3a device in saturation, which results in not well-defined biasing and operating points leading to degraded performance and risk of functionality failures. Embodiments of FIGS. 4-9 provide additional enhancements to the output stage 200 to operate the OTA output stage at lower Vdd (e.g., 0.8V).

Figure 4:
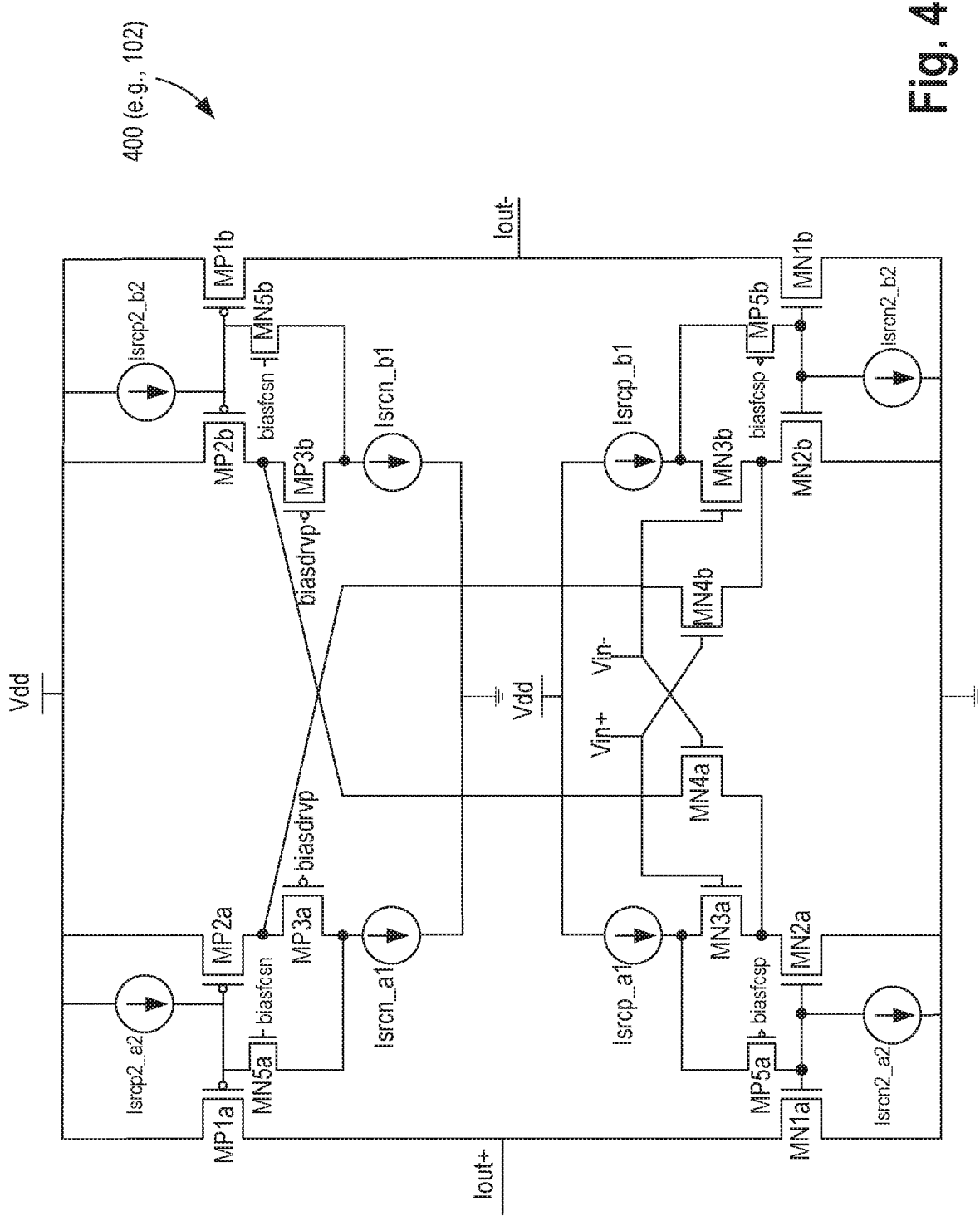
FIG. 4 illustrates a PVT tolerant low voltage class AB OTA output stage with folded cascodes, in accordance with some embodiments.

FIG. 4 illustrates a PVT tolerant low voltage class AB OTA output stage 400 with folded cascodes, in accordance with some embodiments. So as not to obscure the embodiment of FIG. 4, differences between FIG. 2 and FIG. 4 are discussed. In some embodiments, output stage 400 comprises at least four folded cascode transistors MP5a, MP5b, MN5a, and MN5b. Bias voltages biasfcsp and biasfcsn bias the folded cascode transistors. For example, biasfcsp biases the p-type folded cascode transistors MP5a, MP5b while biasfcsn biases the n-type folded cascode transistors MN5a, MN5b. Additional current sources are coupled in series with each folded cascode transistor. For example, n-type current source Isrcn2_a2 is coupled in series with p-type folded cascode transistor MP5a, n-type current source Isrcn2_b2 is coupled in series with p-type folded cascode transistor MP5b, p-type current source Isrcp2_a2 is coupled in series with n-type folded cascode transistor MN5a, and p-type current source Isrcp2_b2 is coupled in series with n-type folded cascode transistor MN5b.

The addition of folded cascode transistors and their corresponding current sources keeps the architecture of FIG. 4 compatible with ultra-low voltage supplies. Moreover, it does not add any considerable parasitics since the cascode devices are small. The folded cascode transistors MP5a, MP5b, MN5a, and MN5b provide high output impedance which directly increases the gain of OTA output stage 400 compared to OTA output stage 200. The folded cascode transistors MP5a, MP5b, MN5a, and MN5b also help to achieve high bandwidth and high swing. In various embodiments, the folded cascode transistors in class AB OTA output stage 400 are arranged to keep the headroom requirements to a minimum while achieving the benefits of the folded cascode transistors. For example, folded cascode devices guarantee that transistors MN3a, MN3b, MP3a, MP3b remain in saturation region even at extreme process and temperature corners. Furthermore, nodes attached to sources of the folded cascode devices experience low voltage AC swings due to low input impedance of the source side of the folded cascode devices, improving linearity of the whole amplifier.

In some embodiments, current sources Isrcp_a1, Isrcp_b1, Isrcn_a1, and Isrcn_b1 are made larger (e.g., twice as large as the size of Isrcp_a1, Isrcp_b1, Isrcn_a1, and Isrcn_b1 in OTA output stage 200). One reason for having larger current sources Isrcp_a1, Isrcp_b1, Isrcn_a1, and Isrcn_b1 is to provide adequate current to all the devices as before while providing current flow through the new current sources Isrcp2_a2, Isrcp2_b2, Isrcn2_a2, and Isrcn2_b2. In one example, each current source Isrcp_a1, Isrcp_b1, Isrcn_a1, and Isrcn_b1 provides 50 μA while about 25 μA flows through current sources Isrcp2_a2, Isrcp2_b2, Isrcn2_a2, and Isrcn2_b2.

The size of the folded cascode devices is selected based on the chosen biasing current flowing through them. In one embodiment, if the original current sources Isrcp_a1, Isrcp_b1, Isrcn_a1, and Isrcn_b1 are doubled in width providing twice as much current (ie. 50 uA vs original 25 uA), the surplus 25 uA must flow through the folded cascode devices requiring them to be sized similarly (optimally the same but not necessarily exactly the same) as original driver transistors (ie. MN5a, MN5b similar or optimally same sizes as MN3a and MN3b; MP5a, MP5b similar or optimally same sizes as MP3a and MP3b). The new current sources Isrcp2_a2, Isrcp2_b2, Isrcn2_a2, and Isrcn2_b2 would in this case source (for PMOS source) or sink (for NMOS source) 25 uA and would therefore have the same dimensions as original current sources Isrcp_a1, Isrcp_b1, Isrcn_a1, and Isrcn_b1 in OTA output stage 200.

Figures 5A, 5B:
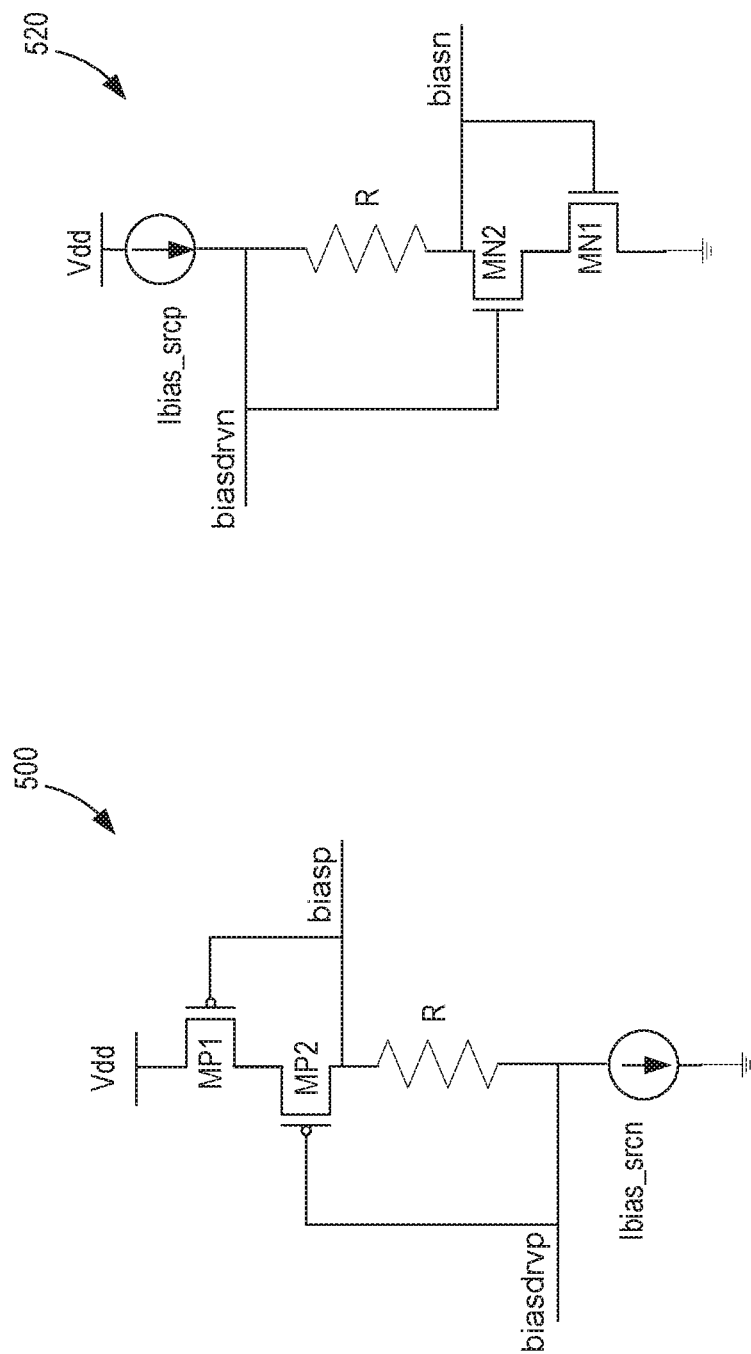
FIGS. 5A-B illustrate nbias and pbias circuits for the PVT tolerant low voltage class AB OTA output stage, in accordance with some embodiments.

FIGS. 5A-B illustrate nbias and pbias circuits 500 and 520, respectively, for the PVT tolerant low voltage class AB OTA output stage 400, in accordance with some embodiments. The same nbias and pbias circuits 500 and 520 can be used for other OTA output stage circuits desired here. In some embodiments, bias circuit 500 generates biasp and biasdrvp, where biasp is used by the p-type current sources Iscrp_a2, Iscrp_b2, Iscrp_a1, Iscrp_b1. In some embodiments, bias circuit 500 comprises p-type transistors MP1 and MP2 coupled in series with resistor R and n-type current source ibias_srcn. The bias voltages are generated by a self-biased system that regulates the bias voltages. For example, biasp is generated by coupling the drain terminal of MP2 to the gate terminal of MP1, while biasdrvp is generated by coupling a terminal of resistor R with the gate terminal of MP2. In some embodiments, biasdrvp voltage can be reused as a biasing voltage biasfcsp of the folded cascode devices MP5a and MP5b.

In some embodiments, bias circuit 520 generates biasn and biasdrvn, where biasn is used by the n-type current sources Iscrn_a2, Iscrn_b2, Iscrn_a1, Iscrn_b1. In some embodiments, bias circuit 520 comprises n-type transistors MN1 and MN2 coupled in series with resistor R and p-type current source ibias_srcp. The bias voltages are generated by a self-biased system that regulates the bias voltages. For example, biasn is generated by coupling the drain terminal of MN2 to the gate terminal of MN1, while biasdrvn is generated by coupling a terminal of resistor R with the gate terminal of MN2. In some embodiments, biasdrvn voltage can be reused as a biasing voltage biasfcsn of the folded cascode devices MN5a and MN5b.

In some embodiments, resistor R is implemented as a transistor operating in linear region. In some embodiments, resistor R is a discrete resistor device offered by a process technology node. For example, resistor R is a poly resistor. In some embodiments, resistor R is a combination of a transistor and a resistor available by the process node.

Figure 6:
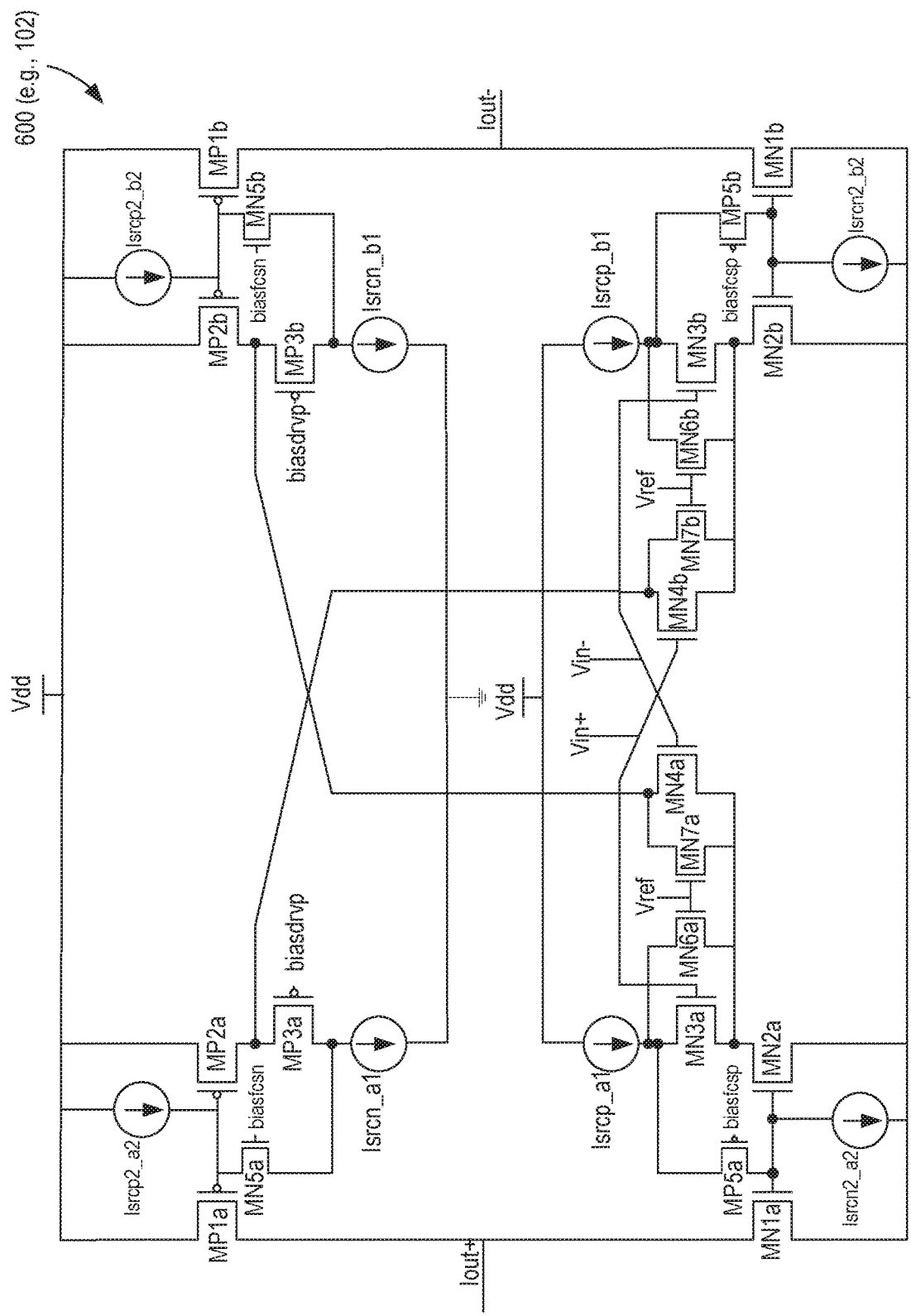
FIG. 6 illustrates a PVT tolerant low voltage class AB OTA output stage with folded cascodes and startup circuitry, in accordance with some embodiments.

FIG. 6 illustrates a PVT tolerant low voltage class AB OTA output stage 600 with folded cascodes and startup circuitry, in accordance with some embodiments. In some cases (e.g., under certain PVT conditions), OTA 200 or 400 may not startup because when power is ramped up, the devices may not receive the current and bias voltages to cause current to flow through the cross-coupled architecture of the OTA. For example, when OTA is used in an active filter and the filter does not receive enough support from its preceding circuitry, the OTA may not receive Vin+ and Vin− to cause the devices of OTA to be biased and have current flowing through them. In those cases, n-type startup devices (or helper devices) MN6a, MN7a, MN6b, and MN7b are added.

These devices are biased by Vref (e.g., ½ of Vdd, or a common mode of Vin+ and Vin−). In one example, the same Vref that is used for regulating common mode levels of Vin+ and Vin− can also be used for biasing the startup transistors. Startup transistors MN7a and MN7b are coupled in parallel to the input transistors MN4a and MN4b, respectively. Startup transistors MN6a and MN6b are coupled in parallel to the input (or drive) transistors MN3a and MN3b, respectively. Without such helper devices and with input n-type driver transistors (e.g., MN3a, MN4a, MN3b, and MN4b) remaining off during startup phase due to poor common mode control strength of the preceding block, excessively long startup times for certain PVT corners may be experienced. In such a case, the input devices MN3a, MN4a, MN3b, and MN4b may be off and the OTA output stage draws considerable amount of biasing current, pulling the outputs Iout+ and Iout− and via feedback network, input nodes to ground. In some PVT cases, OTA output may oscillate causing the entire OTA output stage to become unstable. To mitigate such cases, helper devices MN6a, MN7a, MN6b, and MN7b are added and biased by Vref.

In some embodiments, gate voltages of the startup devices is set to ground to turn off the startup devices after the OTA is up and running. For example, after a startup duration (e.g., 1 nanoseconds (ns)), gate voltages of the startup transistors are set to 0. In some embodiments, the startup devices remain on all the time the OTA is operating. The startup duration is defined as a time duration from OTA being waken up (e.g., when it receives Vin+ and Vin− and when Vdd has ramped up as its expected value) to a time when all devices in OTA are biased at expected values causing current to flow through all transistors.

In some embodiments, when startup devices are not turned off after startup, they can be biased using the same Vref as the Vref used as reference for common mode regulation. In some embodiments, if it is planned to turn off startup devices after startup, then their gates are controlled by a bias voltage independent from Vref.

Figure 7:
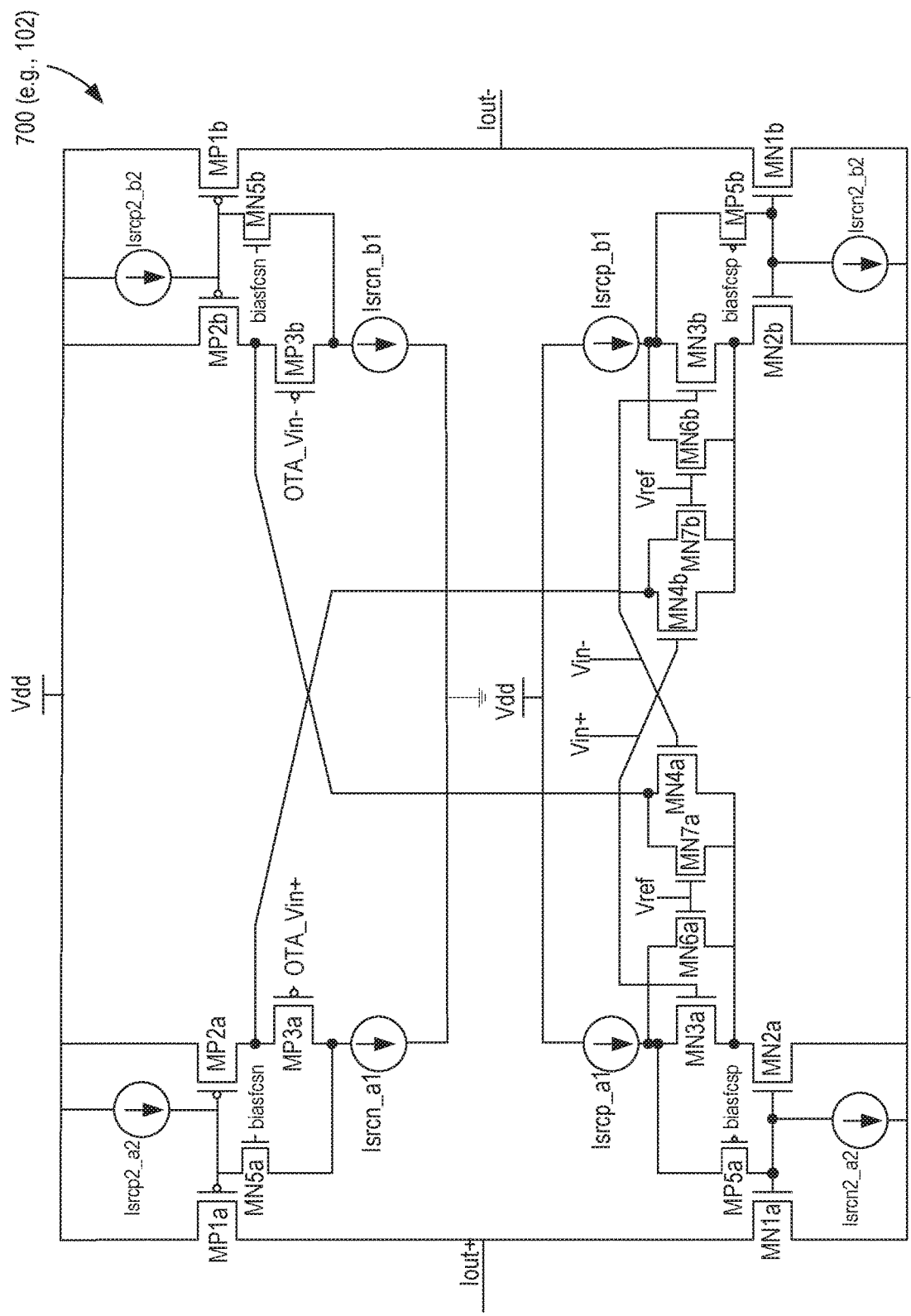
FIG. 7 illustrates a PVT tolerant low voltage class AB OTA output stage with folded cascodes and devices to improve phase margin using feed-forward mechanism, in accordance with some embodiments.

FIG. 7 illustrates a PVT tolerant low voltage class AB OTA output stage 700 with folded cascodes and devices to improve phase margin using feed-forward mechanism, in accordance with some embodiments. The term phase margin (PM) is generally referred to as a difference between the phase of OTA and 180°, for the OTA's output signal relative to its input at zero dB gain. In the presence of negative feedback, a zero or negative PM at a frequency where the loop gain exceeds unity (1) results in instability. Therefore, positive PM ensures proper (non-oscillatory) operation of OTA. To keep OTA in stable conditions during its operation, generally, a PM of 45 or greater is desired. The higher the PM, the more stable the OTA behaves even with higher gain.

In the embodiment of FIG. 2, n-type drivers MN3a and MN3b behave as trans-conductors while the corresponding p-type devices MP3a and MP3b are used as common gate amplifiers. These common gate amplifiers provide low source node impedance but do not amplify the input signal Vin+ and Vin− of the whole OTA. In some embodiments, the gates of those p-type drivers are driven with differential input voltages of the whole OTA instead of being fixed at some biasing potential as shown in OTA output stage 700. In some embodiments, MP3a is driven by OTA_Vin+ while MP3b is driven by OTA_Vin−. These inputs are the inputs to OTA input stage 101. By applying the OTA inputs and the outputs of pre-amplifier 101 inside OTA output stage 102, a feedforward path is created which increases the PM. For example, by bypassing the OTA input stage and using its input directly impact the phase margin of OTA output stage 102 leading to more stable/robust operation over PVT corners and when large signals are processed by OTA 102. As such, PM is increased using the design of FIG. 4 without additional increase in power.

Figure 8:
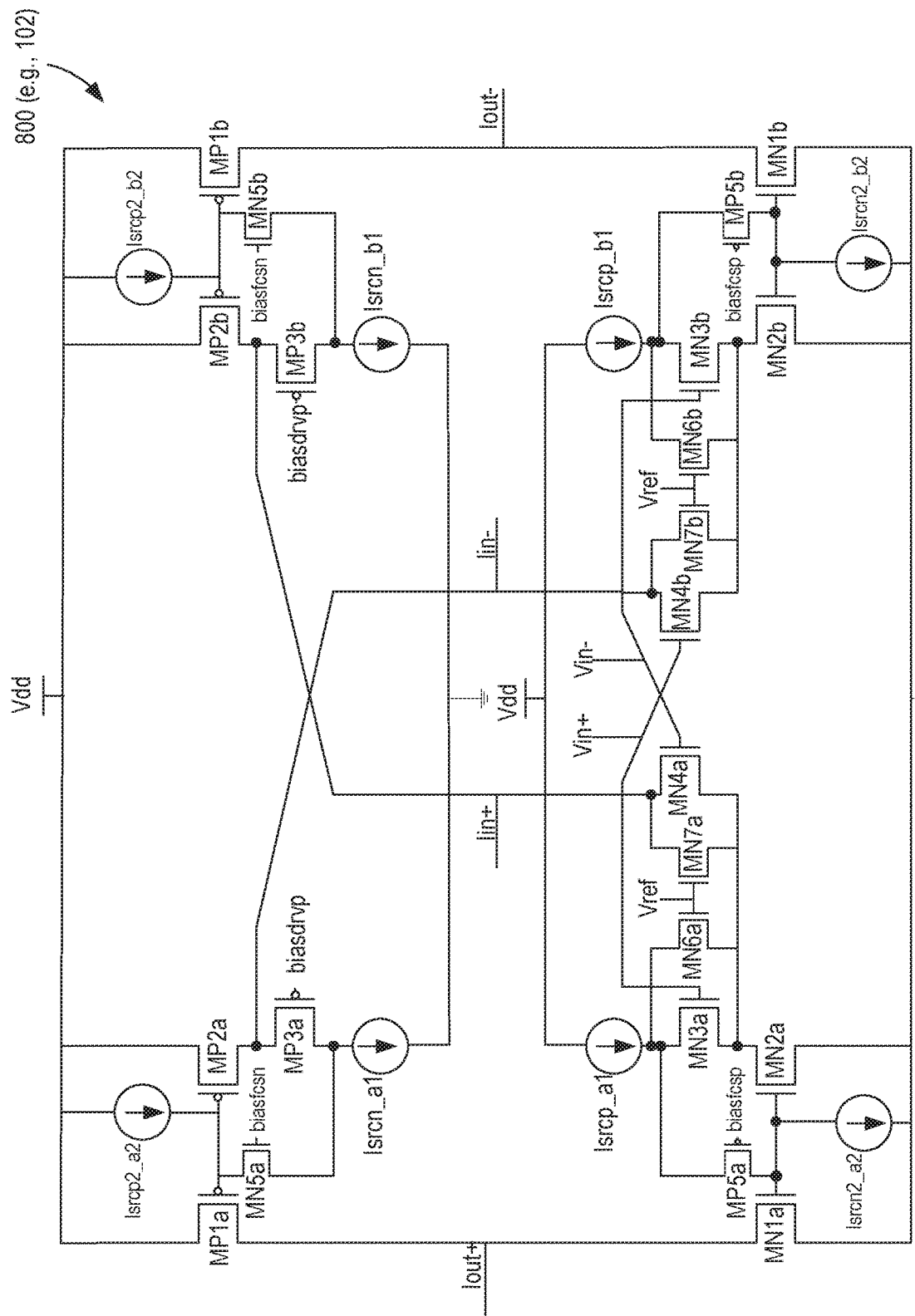
FIG. 8 illustrates a PVT tolerant low voltage class AB OTA output stage with folded cascodes and gm feed-forward mechanism to improve phase margin, in accordance with some embodiments.

FIG. 8 illustrates a PVT tolerant low voltage class AB OTA output stage 800 with folded cascodes and trans-conductance (gm) feed-forward mechanism to improve phase margin, in accordance with some embodiments. The gm (trans-conductance) feed-forward mechanism is based on injecting differential currents Iin+ and Iin− to the drain nodes of the n-type driver devices MN3a and MN3b. The differential currents Iin+ and Iin− can be generated by using a dedicated gm stage placed in parallel to the main voltage-mode preamplifier 101. As the main preamplifier 101 contains a dominant frequency-compensation pole, the fast gm-path bypasses it, providing sufficient gain at high frequencies to influence phase characteristics of the overall amplifier. In one example, the additional current (e.g., 25-50 uA) to bias the fast gm stage improves phase margins more than the feed-forward mechanism of FIG. 7.

Figure 9A:
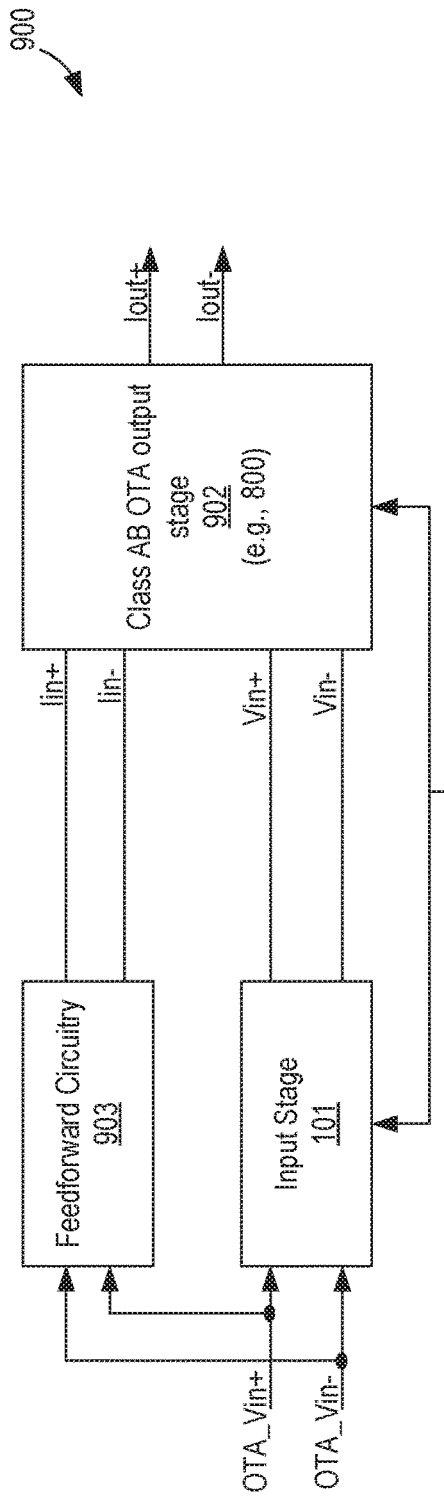
FIG. 9A illustrates a high-level class AB OTA with an input stage and an output stage and with feed-forward electrical path, in accordance with some embodiments.

FIG. 9A illustrates a high-level class AB OTA 900 with an input stage and an output stage and with feed-forward electrical path, in accordance with some embodiments. Input stage 101 is a voltage amplifier which receives input voltage OTA_Vin+ and OTA_Vin− and generates corresponding amplified voltages Vin+ and Vin−. Input stage 101 has common mode feedback loop, and provides the dominant frequency compensation pole. Here, feedforward circuitry 903 is coupled in parallel to input stage 101, where feedforward circuitry 903 receives input voltage OTA_Vin+ and OTA_Vin− and converts them into corresponding currents Iin+ and Iin−. Currents Iin+ and Iin− are received by OTA output stage 902 (e.g., OTA output stage 800).

Figure 9B:
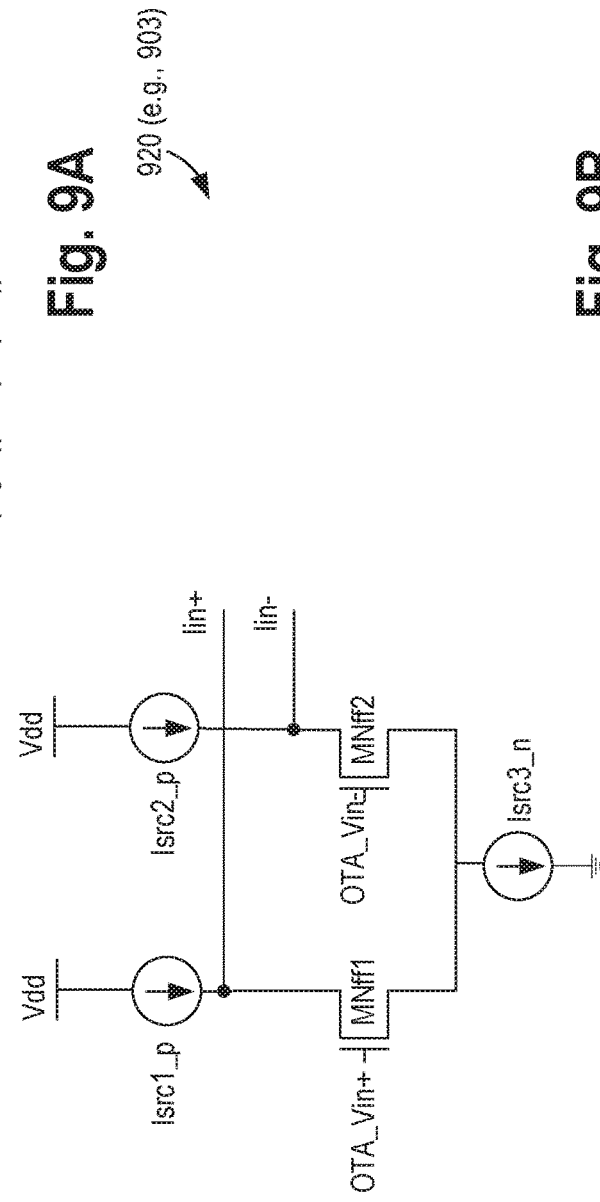
FIG. 9B illustrates a schematic of the feed-forward electrical path, in accordance with some embodiments.

FIG. 9B illustrates a schematic 920 of the feed-forward electrical path, in accordance with some embodiments. Feed-forward circuity 920 (e.g., 903) comprises p-type current sources Isrc1_p and Isrc2_p, and n-type current source Isrc3_n coupled to input transistors MNff1 and MNff2 as shown. OTA input Vin+ is received by the gate of MNff1 which generates corresponding Iin+, while input Vin− is received by the gate of MNff2 which generates corresponding Iin−.

Figure 10:
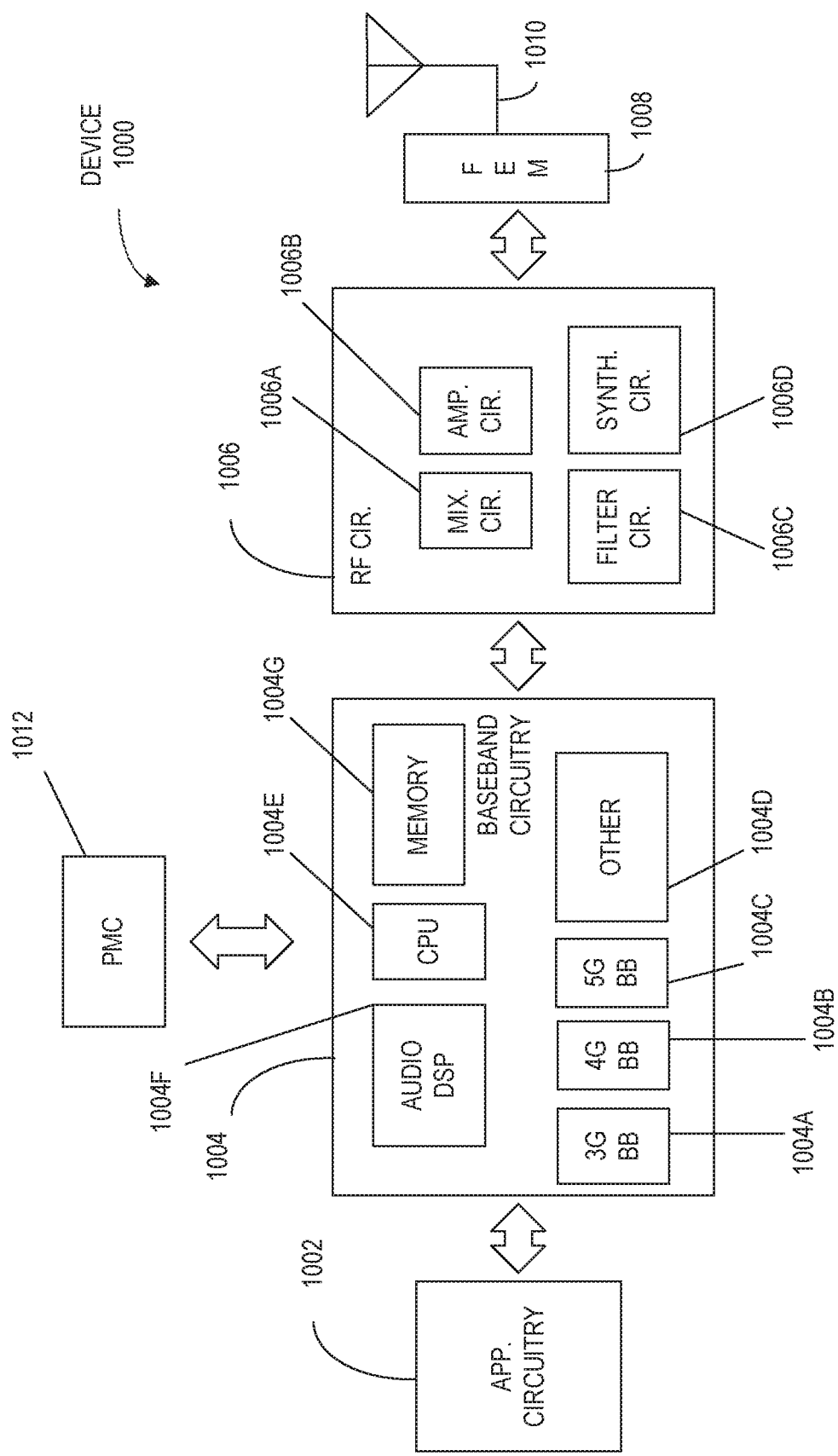
FIG. 10 illustrates a device with the class AB OTA, in accordance with some embodiments.

FIG. 10 illustrates device 1000 with the class AB OTA, in accordance with some embodiments. In some embodiments, the device 1000 may include application circuitry 1002, baseband circuitry 1004, Radio Frequency (RF) circuitry 1006, front-end module (FEM) circuitry 1008, one or more antennas 1010, and power management circuitry (PMC) 1012 coupled at least as shown. The components of the illustrated device 1000 may be included in a UE or a RAN node. In some embodiments, device 1000 may include fewer elements (e.g., a RAN node may not utilize application circuitry 1002, and instead include a processor/controller to process IP data received from an EPC). In some embodiments, device 1000 may include additional elements such as, for example, memory/storage, display, camera, sensor, or input/output (I/O) interface. In other embodiments, the components described below may be included in more than one device (e.g., said circuitries may be separately included in more than one device for Cloud-RAN (C-RAN) implementations).

Application circuitry 1002 may include one or more application processors. For example, application circuitry 1002 may include circuitry such as, but not limited to, one or more single-core or multi-core processors. The processor(s) may include any combination of general-purpose processors and dedicated processors (e.g., graphics processors, application processors, and so on). The processors may be coupled with or may include memory/storage and may be configured to execute instructions stored in the memory/storage to enable various applications or operating systems to run on device 1000. In some embodiments, processors of application circuitry 1002 may process IP data packets received from an EPC.

Baseband circuitry 1004 may include circuitry such as, but not limited to, one or more single-core or multi-core processors. Baseband circuitry 1004 may include one or more baseband processors or control logic to process baseband signals received from a receive signal path of RF circuitry 1006 and to generate baseband signals for a transmit signal path of RF circuitry 1006. Baseband processing circuity 1004 may interface with application circuitry 1002 for generation and processing of the baseband signals and for controlling operations of the RF circuitry 1006.

For example, in some embodiments, baseband circuitry 1004 may include a third generation (3G) baseband processor 1004A, a fourth generation (4G) baseband processor 1004B, a fifth generation (5G) baseband processor 1004C, or other baseband processor(s) 1004D for other existing generations, generations in development or to be developed in the future (e.g., second generation (2G), sixth generation (6G), and so on). Baseband circuitry 1004 (e.g., one or more of baseband processors 1004A-D) may handle various radio control functions that enable communication with one or more radio networks via RF circuitry 1006. In other embodiments, some or all of the functionality of baseband processors 1004A-D may be included in modules stored in memory 1004G and executed via a Central Processing Unit (CPU) 1004E. The radio control functions may include, but are not limited to, signal modulation/demodulation, encoding/decoding, radio frequency shifting, and so on. In some embodiments, modulation/demodulation circuitry of the baseband circuitry 1004 may include Fast-Fourier Transform (FFT), precoding, or constellation mapping/demapping functionality. In some embodiments, encoding/decoding circuitry of baseband circuitry 1004 may include convolution, tail-biting convolution, turbo, Viterbi, or Low Density Parity Check (LDPC) encoder/decoder functionality. Embodiments of modulation/demodulation and encoder/decoder functionality are not limited to these examples and may include other suitable functionality in other embodiments.

In some embodiments, baseband circuitry 1004 may include one or more audio digital signal processor(s) (DSP) 1004F. Audio DSP(s) 1004F may include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of baseband circuitry 1004 and application circuitry 1002 may be implemented together such as, for example, on a system on a chip (SOC).

In some embodiments, baseband circuitry 1004 may provide for communication compatible with one or more radio technologies. For example, in some embodiments, baseband circuitry 1004 may support communication with an evolved universal terrestrial radio access network (EUTRAN) or other wireless metropolitan area networks (WMAN), a wireless local area network (WLAN), a wireless personal area network (WPAN). Embodiments in which baseband circuitry 1004 is configured to support radio communications of more than one wireless protocol may be referred to as multi-mode baseband circuitry.

RF circuitry 1006 may enable communication with wireless networks using modulated electromagnetic radiation through a non-solid medium. In various embodiments, RF circuitry 1006 may include switches, filters, amplifiers, and so on to facilitate the communication with the wireless network. RF circuitry 1006 may include a receive signal path which may include circuitry to down-convert RF signals received from FEM circuitry 1008 and provide baseband signals to the baseband circuitry 1004. RF circuitry 1006 may also include a transmit signal path which may include circuitry to up-convert baseband signals provided by baseband circuitry 1004 and provide RF output signals to FEM circuitry 1008 for transmission.

In some embodiments, the receive signal path of RF circuitry 1006 may include mixer circuitry 1006A, amplifier circuitry 1006B and filter circuitry 1006C. In some embodiments, amplifier circuitry 1006B includes the OTA according to any of the OTAs described herein. In some embodiments, filter circuitry 1006C includes the OTA according to any of the OTAs described herein. In some embodiments, other blocks that use an amplifier may also have any of the OTAs described herein.

In some embodiments, the transmit signal path of RF circuitry 1006 may include filter circuitry 1006C and mixer circuitry 1006A. RF circuitry 1006 may also include synthesizer circuitry 1006D for synthesizing a frequency for use by mixer circuitry 1006A of the receive signal path and the transmit signal path. In some embodiments, mixer circuitry 1006A of the receive signal path may be configured to down-convert RF signals received from FEM circuitry 1008 based on the synthesized frequency provided by synthesizer circuitry 1006D Amplifier circuitry 1006B may be configured to amplify the down-converted signals and filter circuitry 1006C may be a low-pass filter (LPF) or band-pass filter (BPF) configured to remove unwanted signals from the down-converted signals to generate output baseband signals. Output baseband signals may be provided to the baseband circuitry 1004 for further processing. In some embodiments, the output baseband signals may be zero-frequency baseband signals, although this is not a requirement. In some embodiments, mixer circuitry 1006A of the receive signal path may comprise passive mixers, although the scope of the embodiments is not limited in this respect.

In some embodiments, mixer circuitry 1006A of the transmit signal path may be configured to up-convert input baseband signals based on the synthesized frequency provided by synthesizer circuitry 1006D to generate RF output signals for FEM circuitry 1008. The baseband signals may be provided by baseband circuitry 1004 and may be filtered by filter circuitry 1006C.

In some embodiments, mixer circuitry 1006A of the receive signal path and mixer circuitry 1006A of the transmit signal path may include two or more mixers and may be arranged for quadrature down conversion and up conversion, respectively. In some embodiments, mixer circuitry 1006A of the receive signal path and mixer circuitry 1006A of the transmit signal path may include two or more mixers and may be arranged for image rejection (e.g., Hartley image rejection). In some embodiments, the mixer circuitry 1006A of the receive signal path and mixer circuitry 1006A may be arranged for direct down conversion and direct up conversion, respectively. In some embodiments, the mixer circuitry 1006A of the receive signal path and mixer circuitry 1006A of the transmit signal path may be configured for superheterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 1006 may include analog-to-digital converter (ADC) and digital-to-analog converter (DAC) circuitry and baseband circuitry 1004 may include a digital baseband interface to communicate with RF circuitry 1006.

In some dual-mode embodiments, a separate radio IC circuitry may be provided for processing signals for each spectrum, although the scope of the embodiments is not limited in this respect.

In some embodiments, synthesizer circuitry 1006D may be a fractional-N synthesizer or a fractional N/N+1 synthesizer, although the scope of the embodiments is not limited in this respect as other types of frequency synthesizers may be suitable. For example, synthesizer circuitry 1006D may be a delta-sigma synthesizer, a frequency multiplier, or a synthesizer comprising a phase-locked loop with a frequency divider.

Synthesizer circuitry 1006D may be configured to synthesize an output frequency for use by mixer circuitry 1006A of RF circuitry 1006 based on a frequency input and a divider control input. In some embodiments, synthesizer circuitry 1006D may be a fractional N/N+1 synthesizer.

In some embodiments, frequency input may be provided by a voltage controlled oscillator (VCO), although that is not a requirement. Divider control input may be provided by either baseband circuitry 1004 or applications processor 1002 depending on the desired output frequency. In some embodiments, a divider control input (e.g., N) may be determined from a look-up table based on a channel indicated by the applications processor 1002.

Synthesizer circuitry 1006D of RF circuitry 1006 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 1006D may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be an LO frequency (fLO). In some embodiments, RF circuitry 1006 may include an IQ/polar converter.

FEM circuitry 1008 may include a receive signal path which may include circuitry configured to operate on RF signals received from one or more antennas 1010, amplify the received signals and provide the amplified versions of the received signals to RF circuitry 1006 for further processing. FEM circuitry 1008 may also include a transmit signal path which may include circuitry configured to amplify signals for transmission provided by the RF circuitry 1006 for transmission by one or more of the one or more antennas 1010. In various embodiments, the amplification through the transmit or receive signal paths may be done solely in RF circuitry 1006, solely in FEM 1008, or in both RF circuitry 1006 and FEM 1008.

In some embodiments, FEM circuitry 1008 may include a TX/RX switch to switch between transmit mode and receive mode operation. The FEM circuitry may include a receive signal path and a transmit signal path. The receive signal path of FEM circuitry may include an LNA to amplify received RF signals and provide the amplified received RF signals as an output (e.g., to RF circuitry 1006). The transmit signal path of FEM circuitry 1008 may include a power amplifier (PA) to amplify input RF signals (e.g., provided by RF circuitry 1006), and one or more filters to generate RF signals for subsequent transmission (e.g., by one or more of the one or more antennas 1010).

In some embodiments, PMC 1012 may manage power provided to baseband circuitry 1004. In particular, PMC 1012 may control power-source selection, voltage scaling, battery charging, or DC-to-DC conversion. PMC 1012 may often be included when device 1000 is capable of being powered by a battery, for example, when the device is included in a UE. PMC 1012 may increase the power conversion efficiency while providing desirable implementation size and heat dissipation characteristics.

FIG. 10 shows PMC 1012 coupled only with the baseband circuitry 1004. However, in other embodiments, PMC 1012 may be additionally or alternatively coupled with, and perform similar power management operations for, other components such as, but not limited to, application circuitry 1002, RF circuitry 1006, or FEM 1008.

In some embodiments, PMC 1012 may control, or otherwise be part of, various power saving mechanisms of device 1000. For example, if device 1000 is in an RRC_Connected state, where it is still connected to the RAN node as it expects to receive traffic shortly, then it may enter a state known as Discontinuous Reception Mode (DRX) after a period of inactivity. During this state, device 1000 may power down for brief intervals of time and thus save power.

If there is no data traffic activity for an extended period of time, then device 1000 may transition off to an RRC_Idle state, where it disconnects from the network and does not perform operations such as channel quality feedback, handover, and so on. Device 1000 goes into a very low power state and it performs paging where again it periodically wakes up to listen to the network and then powers down again. The device 1000 may not receive data in this state; in order to receive data, it must transition back to RRC_Connected state.

An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

Processors of application circuitry 1002 and processors of baseband circuitry 1004 may be used to execute elements of one or more instances of a protocol stack. For example, processors of baseband circuitry 1004, alone or in combination, may be used execute Layer 3, Layer 2, or Layer 1 functionality, while processors of the application circuitry 1004 may utilize data (e.g., packet data) received from these layers and further execute Layer 4 functionality (e.g., transmission communication protocol (TCP) and user datagram protocol (UDP) layers). As referred to herein, Layer 3 may comprise a radio resource control (RRC) layer, described in further detail below. As referred to herein, Layer 2 may comprise a medium access control (MAC) layer, a radio link control (RLC) layer, and a packet data convergence protocol (PDCP) layer, described in further detail below. As referred to herein, Layer 1 may comprise a physical (PHY) layer of a UE/RAN node, described in further detail below.

Figure 11:
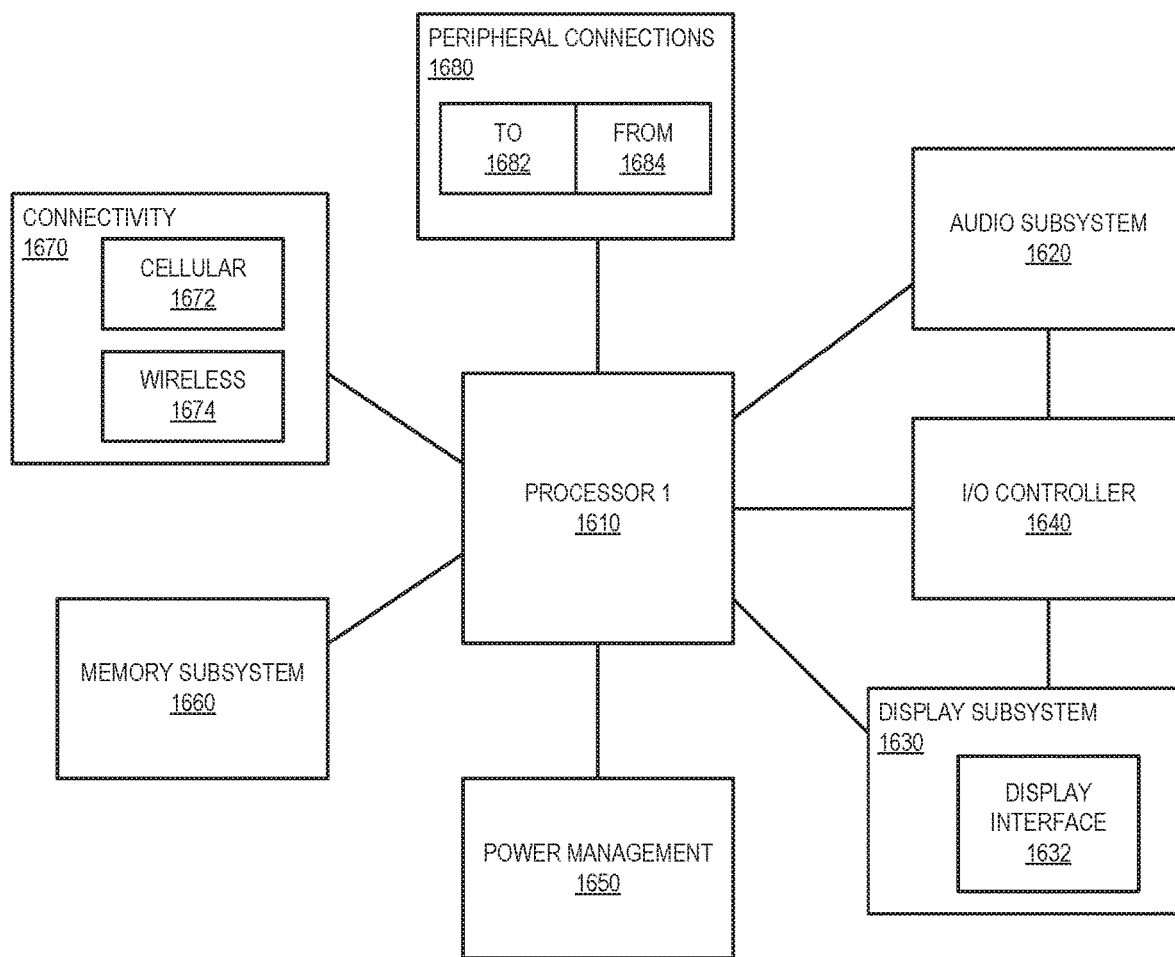
FIG. 11 illustrates a smart device, a computer system, or an SoC (System-on-Chip) with one or more class AB OTAs, according to some embodiments of the disclosure.

FIG. 11 illustrates a smart device, a computer system, or an SoC (System-on-Chip) with one or more class AB OTAs, according to some embodiments of the disclosure. FIG. 9 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It is understood that certain components are shown generally, and not all components of such a device are shown in computing device 1600.

In some embodiments, computing device 1600 includes processor 1610 with one or more class AB OTAs, according to some embodiments discussed. Other blocks of the computing device 1600 may also include one or more class AB OTAs, according to some embodiments.

The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1

An apparatus comprising: a pre-amplifier to receive a first input and a second input, and to generate a first output and a second output which are amplified versions of the first input and second input, respectively; and a differential operational trans-conductance amplifier (OTA) coupled to the pre-amplifier, wherein the differential OTA is to receive the first and second outputs, and to generate first and second current outputs, wherein the differential OTA comprises at least four folded cascode transistors.

Example 2

The apparatus of example 1, wherein the differential OTA comprises first and second transistors to receive the amplified versions of the first and second inputs at their corresponding gate terminals, respectively, wherein the first and second transistors are coupled to first and second folded cascode transistors, respectively, of the at least four folded cascode transistors, and wherein the first and second folded cascode transistors are of a first conductivity type.

Example 3

The apparatus of example 2, wherein the differential OTA comprises a first current source coupled in series to the first folded cascode transistor and a first reference supply rail.

Example 4

The apparatus of example 2, wherein the differential OTA comprises a second current source coupled in series to the second folded cascode transistor and a second reference supply rail.

Example 5

The apparatus of example 2, wherein the first and second folded cascode transistors are to receive a first bias, and wherein the at least four folded cascode transistors further comprises third and fourth folded cascode transistors to receive a second bias separate from the first bias.

Example 6

The apparatus of example 5, wherein the third and fourth folded cascode transistors are of a second conductivity type.

Example 7

The apparatus of example 6, wherein the differential OTA comprises at least four transistors of the second conductivity type, wherein the at least four transistors have gate terminals coupled to a control node that provides a control voltage, wherein a first transistor of the at least four transistors is coupled to the first transistor that receives the amplified version of the first input, wherein a second transistor of the at least four transistors is coupled to the first folded cascode transistor.

Example 8

The apparatus of example 7, wherein a third transistor of the at least four transistors is coupled to the second transistor that receives the amplified version of the second input, and wherein a fourth transistor of the at least four transistors is coupled to the second folded cascode transistor.

Example 9

The apparatus of example 7, wherein the control voltage causes the at least four transistors to turn off after a startup duration.

Example 10

The apparatus of example 7, wherein the control voltage is provided to the at least four transistors at a startup duration.

Example 11

The apparatus of example 7, wherein each of the at least four transistors is smaller in size than each of the first and second transistors that receive the amplified versions of the first and second inputs, respectively.

Example 12

The apparatus of example 7, wherein the control voltage is programmable.

Example 13

The apparatus of example 2, comprises a trans-conductance stage coupled to the pre-amplifier, wherein the trans-conductance stage receives the first and second inputs, and provides first and second currents, wherein the first and second currents from the trans-conductance stage are provided to drain terminals of the first and second transistors that receive the amplified versions of the first and second inputs at their corresponding gate terminals, respectively.

Example 14

An apparatus comprising: a pre-amplifier to receive a first input and a second input, and to generate a first output and a second output which are amplified versions of the first input and second input, respectively; and a differential operational trans-conductance amplifier (OTA) coupled to the pre-amplifier, wherein the differential OTA comprises: first and second transistors of a first conductivity type, wherein the first and second transistors are to receive the amplified versions of the first and second inputs, respectively; and third and fourth transistors coupled to the first and second transistors, wherein the third and fourth transistors are of a second conductivity type, and wherein gate terminals of the third and fourth transistors receive the first and second inputs respectively.

Example 15

The apparatus of example 14, wherein the differential OTA comprises at least four folded cascode transistors, wherein the first and second transistors are coupled to first and second folded cascode transistors, respectively, of the at least four folded cascode transistors, and wherein the first and second folded cascode transistors are of the first conductivity type.

Example 16

The apparatus of example 15, wherein the differential OTA comprises a first current source coupled in series to the first folded cascode transistor and a first reference supply rail.

Example 17

The apparatus of example 14, wherein the differential OTA comprises a second current source coupled in series to the second folded cascode transistor and a second reference supply rail.

Example 18

The apparatus of example 14, wherein the first and second folded cascode transistors to receive a first bias, wherein the at least four folded cascode transistors further comprises third and fourth folded cascode transistors to receive a second bias separate from the first bias, and wherein the third and fourth folded cascode transistors are of a second conductivity type.

Example 19

A system comprising: an antenna; an RF front-end coupled to the antenna; a class AB differential operational trans-conductance amplifier (OTA) coupled to the RF front-end, wherein the differential OTA comprises: a pre-amplifier input stage to receive a first input and a second input, and to generate a first output and a second output which are amplified versions of the first input and second input, respectively; and a differential OTA output stage coupled to the pre-amplifier input stage, wherein the differential OTA output stage is to receive the first and second outputs, and to generate first and second current outputs, and wherein the differential OTA output stage comprises at least four folded cascode transistors.

Example 20

The system of example 19, wherein the differential OTA output stage comprises first and second transistors to receive the amplified versions of the first and second inputs at their corresponding gate terminals, respectively, wherein the first and second transistors are coupled to first and second folded cascode transistors, respectively, of the at least four folded cascode transistors, and wherein the first and second folded cascode transistors are of a first conductivity type.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a pre-amplifier to receive a first input and a second input, and to generate a first output and a second output which are amplified versions of the first input and second input, respectively;
   a differential operational trans-conductance amplifier (OTA) coupled to the pre-amplifier, wherein the differential OTA is to receive the first and second outputs, and to generate first and second current outputs, and wherein the differential OTA comprises at least four folded cascode transistors; and
   a trans-conductance stage coupled to the pre-amplifier and the differential OTA.

2. The apparatus of claim 1, wherein the differential OTA comprises first and second transistors to receive the amplified versions of the first and second inputs at their corresponding gate terminals, respectively, wherein the first and second transistors are coupled to first and second folded cascode transistors, respectively, of the at least four folded cascode transistors, and wherein the first and second folded cascode transistors are of a first conductivity type.

3. The apparatus of claim 2, wherein the differential OTA comprises a first current source coupled in series to the first folded cascode transistor and a first reference supply rail.

4. The apparatus of claim 2, wherein the differential OTA comprises a second current source coupled in series to the second folded cascode transistor and a second reference supply rail.

5. The apparatus of claim 2, wherein the first and second folded cascode transistors are to receive a first bias, and wherein the at least four folded cascode transistors further comprises third and fourth folded cascode transistors to receive a second bias separate from the first bias.

6. The apparatus of claim 5, wherein the third and fourth folded cascode transistors are of a second conductivity type.

7. The apparatus of claim 6, wherein the differential OTA comprises at least four transistors of the second conductivity type, wherein the at least four transistors have gate terminals coupled to a control node that provides a control voltage, wherein a first transistor of the at least four transistors is coupled to the first transistor that receives the amplified version of the first input, and wherein a second transistor of the at least four transistors is coupled to the first folded cascode transistor.

8. The apparatus of claim 7, wherein a third transistor of the at least four transistors is coupled to the second transistor that receives the amplified version of the second input, and wherein a fourth transistor of the at least four transistors is coupled to the second folded cascode transistor.

9. The apparatus of claim 7, wherein the control voltage causes the at least four transistors to turn off after a startup duration.

10. The apparatus of claim 7, wherein the control voltage is provided to the at least four transistors at a startup duration.

11. The apparatus of claim 7, wherein each of the at least four transistors is smaller than each of the first and second transistors that receive the amplified versions of the first and second inputs, respectively.

12. The apparatus of claim 7, wherein the control voltage is programmable.

13. The apparatus of claim 2, wherein the trans-conductance stage receives the first and second inputs, and provides first and second currents, and wherein the first and second currents from the trans-conductance stage are provided to drain terminals of the first and second transistors that receive the amplified versions of the first and second inputs at their corresponding gate terminals, respectively.

14. An apparatus comprising:
a pre-amplifier to receive a first input and a second input, and to generate a first output and a second output which are amplified versions of the first input and second input, respectively;
a differential operational trans-conductance amplifier (OTA) coupled to the pre-amplifier; and
a trans-conductance stage coupled to the pre-amplifier and the differential OTA, wherein the differential OTA comprises:
first and second transistors of a first conductivity type, wherein the first and second transistors are to receive the amplified versions of the first and second inputs, respectively; and
third and fourth transistors coupled to the first and second transistors, wherein the third and fourth transistors are of a second conductivity type, wherein gate terminals of the third and fourth transistors receive the first and second inputs respectively, and wherein the differential OTA is to generate first and second current outputs.

15. The apparatus of claim 14, wherein the differential OTA comprises at least four folded cascode transistors, wherein the first and second transistors are coupled to first and second folded cascode transistors, respectively, of the at least four folded cascode transistors, and wherein the first and second folded cascode transistors are of the first conductivity type.

16. The apparatus of claim 15, wherein the differential OTA comprises a first current source coupled in series to the first folded cascode transistor and a first reference supply rail.

17. The apparatus of claim 14, wherein the differential OTA comprises a second current source coupled in series to a second folded cascode transistor and a second reference supply rail.

18. The apparatus of claim 15, wherein the first and second folded cascode transistors to receive a first bias, wherein the at least four folded cascode transistors further comprises third and fourth folded cascode transistors to receive a second bias separate from the first bias, and wherein the third and fourth folded cascode transistors are of a second conductivity type.

19. A system comprising:
an antenna;
an RF front-end coupled to the antenna; and
a class AB differential operational trans-conductance amplifier (OTA) coupled to the RF front-end, wherein the differential OTA comprises:
a pre-amplifier input stage to receive a first input and a second input, and to generate a first output and a second output which are amplified versions of the first input and second input, respectively; and
a differential OTA output stage coupled to the pre-amplifier input stage, wherein the differential OTA output stage is to receive the first and second outputs, and to generate first and second current outputs, and wherein the differential OTA output stage comprises at least four folded cascode transistors.

20. The system of claim 19, wherein the differential OTA output stage comprises first and second transistors to receive the amplified versions of the first and second inputs at their corresponding gate terminals, respectively, and wherein the first and second transistors are coupled to first and second folded cascode transistors, respectively, of the at least four folded cascode transistors.

* * * * *